(12) United States Patent
Harris et al.

(10) Patent No.: US 9,226,420 B2
(45) Date of Patent: Dec. 29, 2015

(54) FRAMELESS TELECOMMUNICATIONS ENCLOSURE

(71) Applicant: Adtran Inc., Huntsville, AL (US)

(72) Inventors: Jeremy Lee Harris, Harvest, AL (US); Paul S. Wein, Jr., New Market, AL (US); Jon Michael Chalmers, Madison, AL (US)

(73) Assignee: Adtran Inc., Huntsville, AL (US)

( * ) Notice: Subject to any disclaimer, the term of this patent is extended or adjusted under 35 U.S.C. 154(b) by 21 days.

(21) Appl. No.: 14/291,453

(22) Filed: May 30, 2014

(65) Prior Publication Data

US 2015/0351268 A1    Dec. 3, 2015

(51) Int. Cl.
| | | |
|---|---|---|
| H05K 5/00 | (2006.01) | |
| H05K 5/02 | (2006.01) | |
| H05K 5/06 | (2006.01) | |
| F16J 15/10 | (2006.01) | |

(52) U.S. Cl.
CPC .............. *H05K 5/0239* (2013.01); *F16J 15/10* (2013.01); *H05K 5/0213* (2013.01); *H05K 5/0247* (2013.01); *H05K 5/06* (2013.01)

(58) Field of Classification Search
CPC ........... H05K 5/02; H05K 5/06; H05K 5/061; H05K 5/0247; F16J 15/10
USPC ......... 312/257.1, 263, 264, 265, 265.5, 265.6
See application file for complete search history.

(56) References Cited

U.S. PATENT DOCUMENTS

| | | | | |
|---|---|---|---|---|
| 4,319,793 | A * | 3/1982 | Suttles ....................... | 312/257.1 |
| 5,210,984 | A * | 5/1993 | Eckel .............................. | 52/79.5 |
| 5,979,672 | A * | 11/1999 | Gemra et al. .................... | 211/26 |
| 6,202,860 | B1 * | 3/2001 | Ludwig ........................... | 211/26 |
| 6,303,854 | B1 * | 10/2001 | Papaleo et al. ................ | 174/382 |
| 6,478,391 | B1 * | 11/2002 | Stoever ....................... | 312/265.5 |
| 6,988,780 | B2 * | 1/2006 | Anderson et al. ............. | 312/323 |
| 7,441,847 | B2 * | 10/2008 | Francisquini ............... | 312/265.3 |
| 8,056,993 | B2 * | 11/2011 | Stock et al. .................... | 312/329 |
| 8,721,010 | B2 * | 5/2014 | Conrardy et al. .......... | 312/223.1 |
| 2004/0007951 | A1 * | 1/2004 | Holighaus et al. .......... | 312/265.4 |
| 2005/0206280 | A1 * | 9/2005 | Mehmen et al. ........... | 312/257.1 |
| 2008/0238277 | A1 * | 10/2008 | Geng ............................ | 312/326 |
| 2013/0120916 | A1 * | 5/2013 | Leslie et al. .............. | 361/679.01 |

* cited by examiner

*Primary Examiner* — Daniel Rohrhoff
(74) *Attorney, Agent, or Firm* — Fish & Richardson P.C.

(57) ABSTRACT

Telecommunications enclosures are described in this document. In one aspect, a telecommunications enclosure includes side panels having seals and an enclosure top connected, independent of a frame, to top ends of the side panels. The enclosure top has an enclosure top outer end that extends between the side panels and includes a seal. An interior panel is connected, independent of a frame, to side panels and has an interior panel outer end that extends between the side panels. The interior panel is separated from the enclosure top by a first distance and separated by a second distance from bottom ends of the side panels. A removable door is formed to engage the seals when the removable door is secured to the frameless telecommunications enclosure.

21 Claims, 7 Drawing Sheets

FRAMELESS TELECOMMUNICATIONS ENCLOSURE

BACKGROUND

This specification relates to telecommunications enclosures.

Telecommunications enclosures are used to house telecommunications equipment. Generally, telecommunications enclosures protect telecommunications equipment (e.g., Digital Subscriber Line (DSL) equipment or Passive Optical Network (PON) equipment) from exposure to moisture, lightning, earthquakes, and extreme temperatures.

SUMMARY

In general, one innovative aspect of the subject matter described in this specification can be embodied in a telecommunications enclosure including a first side panel having a first outer end that includes a first seal; a second side panel having a second outer end that includes a second seal; an enclosure top connected, independent of a frame, to a top end of the first side panel and a top end of the second side panel, the enclosure top having an enclosure top outer end that extends from the first side panel to the second side panel and includes a third seal; an interior panel connected, independent of a frame, to each of the first side panel and the second side panel and having an interior panel outer end that extends from the first side panel to the second side panel and includes a fourth seal, the interior panel being separated from the enclosure top by a first specified distance and being separated by a second specified distance from a bottom end of each of the first side panel and the second side panel; and a removable door that is formed to engage each of the first seal, the second seal, the third seal, and the fourth seal when the removable door is secured to the frameless telecommunications enclosure.

These and other embodiments can each optionally include one or more of the following features. The removable door can have a main door portion formed in a first plane and protruding ends that extend out from the main door portion in a second plane that intersects the first plane. The main door portion and the protruding ends can be formed from a continuous piece of metal. At least a portion of the protruding ends can engage one of the first seal, the second seal, or the third seal when the removable door is secured to the frameless telecommunications enclosure.

The removable door can include a sealing member that engages the fourth seal when the removable door is secured to the frameless telecommunications enclosure. A moisture sealed equipment chamber can be provided when the sealing member engages the fourth seal and the protruding ends engage each of the first seal, the second seal, and the third seal.

One of the protruding ends can have one or more slots defined therein to receive tabs protruding from an enclosure bottom that is connected, independent of a frame, to the bottom end of each of the first side panel and the second side panel. The removable door can include a rain lip that extends out from the main portion of the removable door.

At least one of the first side panel, the second side panel, or the interior panel can be aluminum. Non-welded fasteners can connect the interior panel to each of the first side panel and the second side panel; and non-welded fasteners can connect the enclosure top to the top end of the first side panel and the top end of the second side panel.

The enclosure top can include a heat exchanger. A battery chamber can be formed in a space between the interior panel and the bottom end of each of the first side panel and the second side panel.

Another innovative aspect of the subject matter described in this specification can be embodied in a method of forming a telecommunications enclosure that includes the actions of connecting, independent of a frame, an enclosure top to a top end of a first side panel and a top end of a second side panel, the enclosure top having an enclosure top outer end that extends between the first side panel and the second side panel; connecting, independent of a frame, an interior panel to each of the first side panel and the second side panel, the interior panel having an interior panel outer end that extends between the first side panel and the second side panel, the interior panel being connected at a specified distance from a bottom end of each of the first side panel and the second side panel; attaching a seal to each of a first outer end of the first side panel, a second outer end of the second side panel, the enclosure top outer end, and the interior panel outer end; engaging protruding ends of a removable door with the seal that is attached to each of the first outer end, the second outer end, the enclosure top outer end; and engaging a sealing member of the removable door with the seal that is attached to the interior panel outer end.

Another innovative aspect of the subject matter described in this specification can be embodied in a method of forming a telecommunications enclosure that includes the actions of forming a first side panel of a frameless telecommunications enclosure, the first side panel being formed to have a first outer end that includes a first seal; forming a second side panel of a frameless telecommunications enclosure, the second side panel being formed to have a second outer end that includes a second seal; forming an enclosure top that connects, independent of a frame, to a top end of the first side panel and a top end of the second side panel, the enclosure top being formed to have an enclosure top outer end that extends from the first side panel to the second side panel and includes a third seal; forming an interior panel that connects, independent of a frame, to each of the first side panel and the second side panel at a specified distance from a bottom end of each of the first side panel and the second side panel, the interior panel being formed to have an interior panel outer end that extends from the first side panel to the second side panel when connected to each of the first side panel and the second side panel, wherein the interior panel outer end is formed to include a fourth seal; and forming a removable door that is formed to include protruding ends that engage each of the first seal, the second seal, the third seal when the removable door is secured to the frameless telecommunications enclosure, the removable door further being formed to include a sealing member that engages the fourth seal when the removable door is secured to the frameless telecommunications enclosure.

Particular embodiments of the subject matter described in this specification can be implemented so as to realize one or more of the following advantages. A lighter modular telecommunications enclosure is installed more easily and more quickly than heavier pre-fabricated telecommunications enclosures. A telecommunications enclosure having a removable door requires less space than a telecommunications enclosure that has a swinging door, thereby enabling the enclosure with the removable door to be installed in more locations than the enclosure with the swinging door.

The details of one or more embodiments of the subject matter described in this specification are set forth in the accompanying drawings and the description below. Other features, aspects, and advantages of the subject matter will become apparent from the description, the drawings, and the claims.

BRIEF DESCRIPTION OF THE DRAWINGS

Like reference numbers and designations in the various drawings indicate like elements.

DETAILED DESCRIPTION

A frameless telecommunications enclosure is described in this document. The frameless telecommunications enclosure provides environmental protection for telecommunications equipment (or other electronics) housed in the telecommunications enclosure. In some implementations, the frameless telecommunications enclosure is a modular enclosure that can be assembled by directly connecting panels of the enclosure together, such that the panels, rather than a frame, provide structural support for the enclosure. In some implementations, the panels of the enclosure are fabricated from aluminum, which is lighter than other metals that can be used to fabricate telecommunications enclosures. Additionally, as discussed in more detail below, the enclosure can include a removable door that slidably engages with the enclosure and includes protruding edges that engage seals of the enclosure to prevent water and dust from entering at least a portion of the enclosure. The removable door requires less opening clearance than hinged doors, which enables the frameless enclosure to be installed in locations where there may not be enough clearance for a hinged door to be opened.

Figure 1:
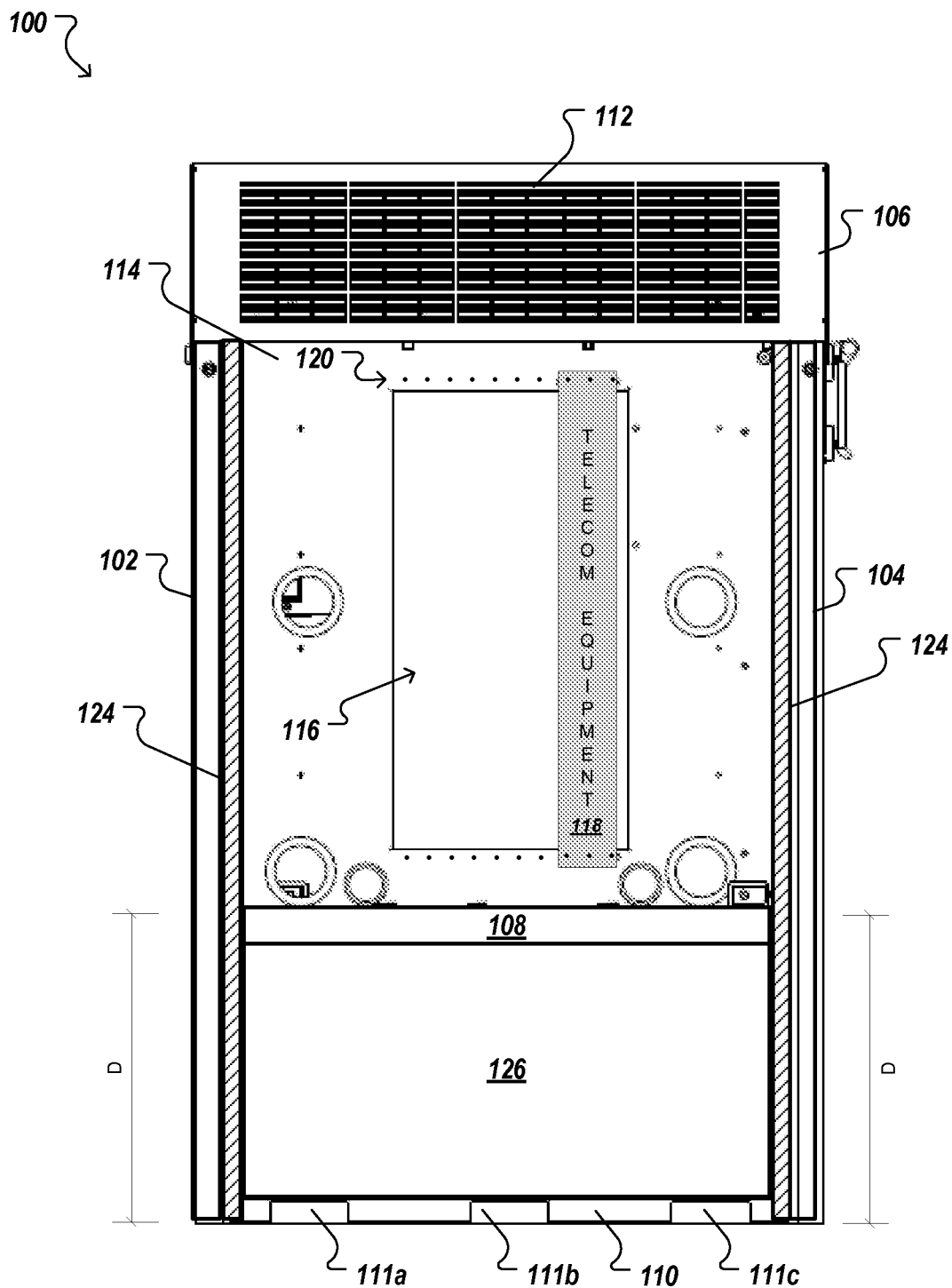
FIG. 1 is a front view of an example frameless telecommunications enclosure.

FIG. 1 is a front view of an example telecommunications enclosure 100. The telecommunications enclosure 100 has a side panel 102, a side panel 104, an enclosure top 106, an interior panel 108, and an enclosure bottom 110. In some implementations, at least some of the panels of the enclosure 100 can be formed using aluminum that has a thickness of less than 0.75 inches. Of course, other metals and/or metal thicknesses can be used. The enclosure 100 is shown without a removable door (discussed with reference to subsequent figures) that is used to enclose items in the enclosure 100. As described in more detail below, the enclosure 100 is frameless, such that the panels discussed are directly connected to each other to provide support for the enclosure independent of an enclosure frame.

The enclosure top 106 is connected to a top end of the side panel 102 and a top end of the side panel 104. The connection between the enclosure top 106 and each of the side panel 102 and side panel 104 can be made independent of a frame. For example, the enclosure top 106 can be directly connected to each of the side panel 102 and side panel 104 by using non-welded fasteners (e.g., screws, bolts, clips, flanges, latches, grommets, pins, snap fasteners, or other fasteners). Ends of the enclosure top that extend between the side panels 102 and 104 are referred to as outer ends of the enclosure top, or as a front outer end of the enclosure top and a back outer end of the enclosure top.

The enclosure top 106 can be a single component or multiple components that together constitute the enclosure top 106. For example, the enclosure top 106 can be a piece of sheet metal (or another material) that is connected to each of the side panel 102 and the side panel 104. In some implementations, the enclosure top includes a heat exchanger that facilitates cooling of the enclosure 100. For example, the enclosure top 106 includes a heat exchanger and heat is removed from the enclosure by way of vents 112 in the enclosure top 106.

The interior panel 108 is also connected to the side panel 102 and the side panel 104. In some implementations, the interior panel 108 is connected to the side panel 102 and the side panel 104 using non-welded fasteners. Ends of the interior panel 108 that extend between the side panels 102 and 104 are referred to as outer ends of the interior panel, or as a front outer end of the interior panel and a back outer end of the interior panel.

In some implementations, the location of the interior panel 108 is based on and/or dictates a size of an equipment chamber that is configured to house telecommunications equipment (or other types of electronic equipment). For example, as illustrated by FIG. 1, the interior panel 108 is connected to the side panel 102 at a location that is a distance "D" from a bottom end of the side panel 102, and connected to the side panel 104 at a location that is also the distance "D" from the bottom end of the side panel 104. In this example, the equipment chamber is the area that is surrounded by the enclosure top 106, the side panel 102, the side panel 104, and the interior support 108.

Within the equipment chamber is a support panel 114. The support panel 114 has a first end that is connected to the side panel 102, a second end that is connected to the enclosure top 106, a third end that is connected to the side panel 104, and a fourth end that is connected to the interior panel 108. As will be shown and discussed in more detail, the support panel 114 can be positioned centrally in the equipment chamber to support the structure of the enclosure 100 and to mount telecommunications equipment that is installed in the equipment chamber. For example, the support panel 114 has an opening 116 defined therein, through which telecommunications equipment 118 can pass.

The support panel 114 includes mounting holes 120 that can be used to mount the telecommunications equipment 118 to the support panel 114. For example, as illustrated by FIG. 1, the telecommunications equipment 118 (or an equipment mounting bracket) can have a front panel that is larger than the opening 116, so that when the telecommunications equipment 118 is inserted into the opening 116, the front panel will prevent the telecommunications equipment 118 from continuing to pass through the opening. The telecommunications equipment 118 can then be secured to the support panel 114 by inserting fasteners (e.g., a screws or bolts) through holes in the front panel of the telecommunications equipment 118 and into the mounting holes 120.

In some implementations, the equipment chamber can be sealed to prevent moisture or dirt from entering the equipment chamber. For example, as discussed in more detail below, a sealing material 124, such as a wiper seal strip or another seal, can be attached proximate to (or at) ends of the panels surrounding the equipment chamber. In a particular example, a wiper seal can be attached to (or near) ends of the side panel 102, side panel 104, enclosure top 106, and interior panel so that when a door (discussed below) is secured to the enclosure 100, the wiper seals will be compressed by portions of the door, which will cause the wiper seals to expand and seal the equipment chamber.

In some implementations, the enclosure 100 includes a battery chamber 126 that is surrounded by the side panel 102, the side panel 104, the interior panel 108, and the enclosure bottom 110. The battery chamber 126 is an area in which backup batteries or other equipment that may need to be separated from the telecommunication equipment (e.g., in order to provide proper ventilation) can be stored. As will be discussed in more detail below, the enclosure bottom can include tabs 111a, 111b, and 111c that can be inserted into slots of a removable door to secure the removable door to the enclosure 100.

In some implementations, the back of the enclosure 100 can be configured in a similar manner as the front of the enclosure that is discussed above. For example, the back of the enclosure 100 can also have sealing material 124 attached to outer ends of the side panel 102 and the side panel 104 so that a removable back door of the enclosure will engage the sealing material to seal the equipment chamber.

Figure 2:
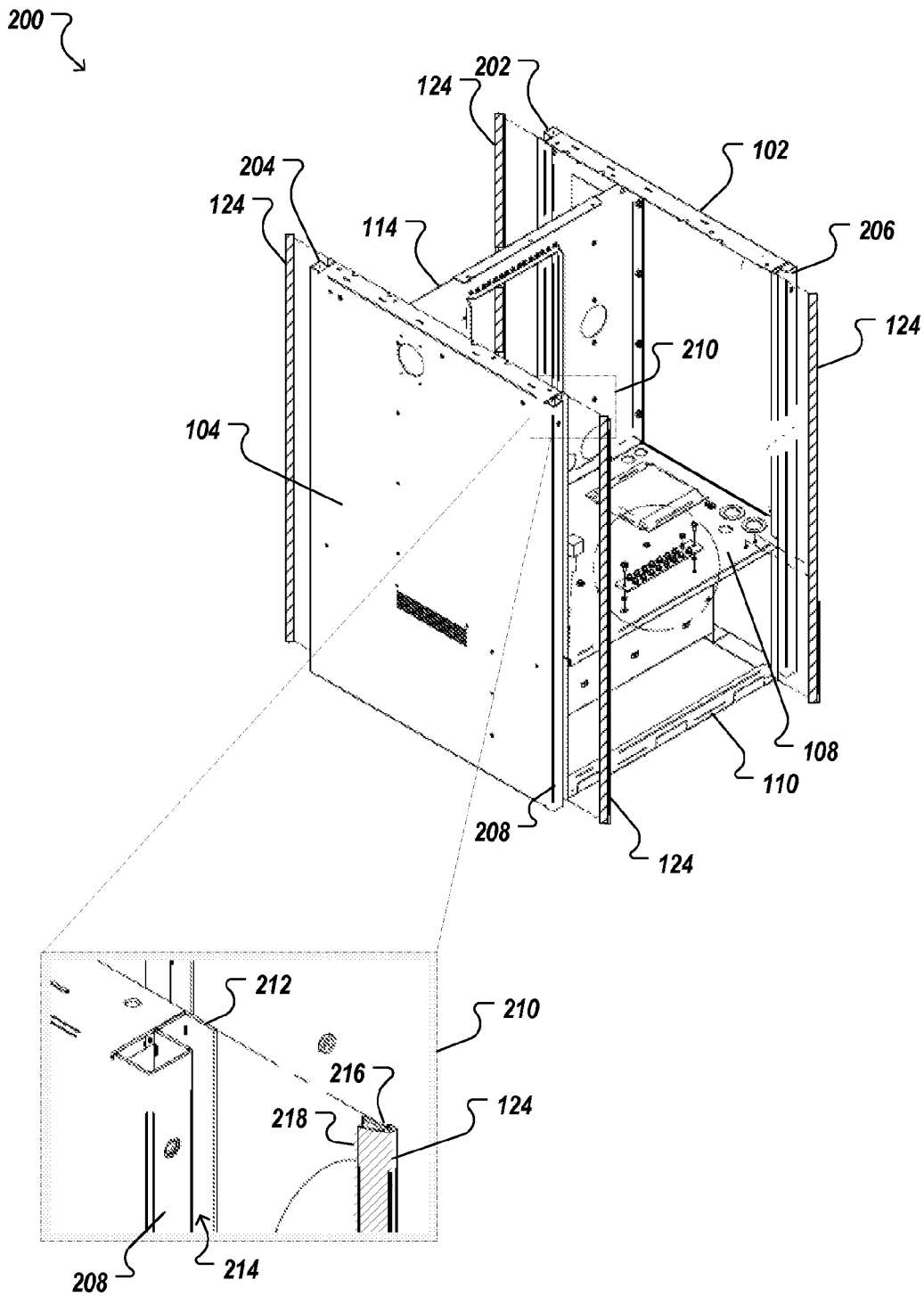
FIG. 2 is an illustration of a partially assembled telecommunications enclosure.

FIG. 2 is an illustration of a partially assembled telecommunications enclosure 200. In FIG. 2, each of the interior panel 108, the support panel 114, and the enclosure bottom 110 have been secured to the side panel 102 and the side panel 104. Each of the interior panel 108, support panel 114, and the enclosure bottom 110 are directly attached to each of the side panel 102 and the side panel 104. In particular, each of the panels shown in FIG. 2 is connected without using a frame, such that the panels themselves provide the structural support for the enclosure.

As illustrated by FIG. 2, the sealing material 124 is attached to outer ends (e.g., a front outer end and a back outer end) of the side panel 102 and outer ends (e.g., a front outer end and a back outer end) of the side panel 104. For example, a piece of sealing material 124, such as a wiper seal strip can be attached to each of an outer front end 202 of the side panel 102, an outer front end 204 of the side panel 104, an outer back end 206 of the side panel 102, and an outer back end 208 of the side panel 104.

In some implementations, the sealing material 124 is attached to each of the side panels by placing the sealing material 124 over a portion of an end of the side panel. For example, as shown in more detail in the expanded view of the boxed area 210, the outer back end 208 of the side panel 104 can include a sealing material mounting edge ("mounting edge") 212 that is configured to receive the sealing material 124. In this example, the mounting edge 212 is formed at the outer back end 208 by bending the material used to form the outer back end 208 to form a "U" shape. Forming the mounting edge 212 using a "U" shape allows an end of the mounting edge 212 to be even with, or recessed, relative to other portions of the outer back end 208. Additionally, the "U" shape provides a recessed portion 214 of the outer back end 208 that can receive a portion of the sealing material 124. Of course, the sealing material 124 can be attached using adhesives or other materials that can be used to attach the sealing material to the side panels 102 and 104.

The expanded view of the boxed area 210 provides a detailed view of sealing material 124 that is formed into a wiper seal, and how the sealing material 124 can be attached to the mounting edge 212. For example, as shown by the expanded view of the boxed area 210, the sealing material 124 can include a mounting portion 216 that slides over the mounting edge 212. The mounting portion 216 can be, for example, two parallel pieces of the sealing material that, when slid over the mounting edge 212 are spread apart, such that the inward force of the two parallel pieces hold the mounting edge 212 in place.

The sealing material 124, as shown in the expanded boxed area 210, also includes a portion 218. When the sealing material 124 is attached to the mounting edge 212, the portion 218 of the sealing material 124 is located in the recessed portion 214 of the back outer end 208. When the removable door (discussed in detail below) is attached to the enclosure 200, protruding ends of the removable door are also inserted into the recessed portion 214, thereby compressing the portion 218, which seals the equipment chamber.

The description above with reference to the back outer end 208, and the description referencing attaching the sealing material 124 to the back outer end 208, is also applicable to the other ends of the side panels 102 and 104. That is, each of the ends 202, 204, and 206 can also be formed in a manner similar to that discussed with respect to the end 208, and the sealing material can be attached to those ends in a similar manner as that discussed with respect to attaching the sealing material 124 to the back outer end 208.

Figure 3:
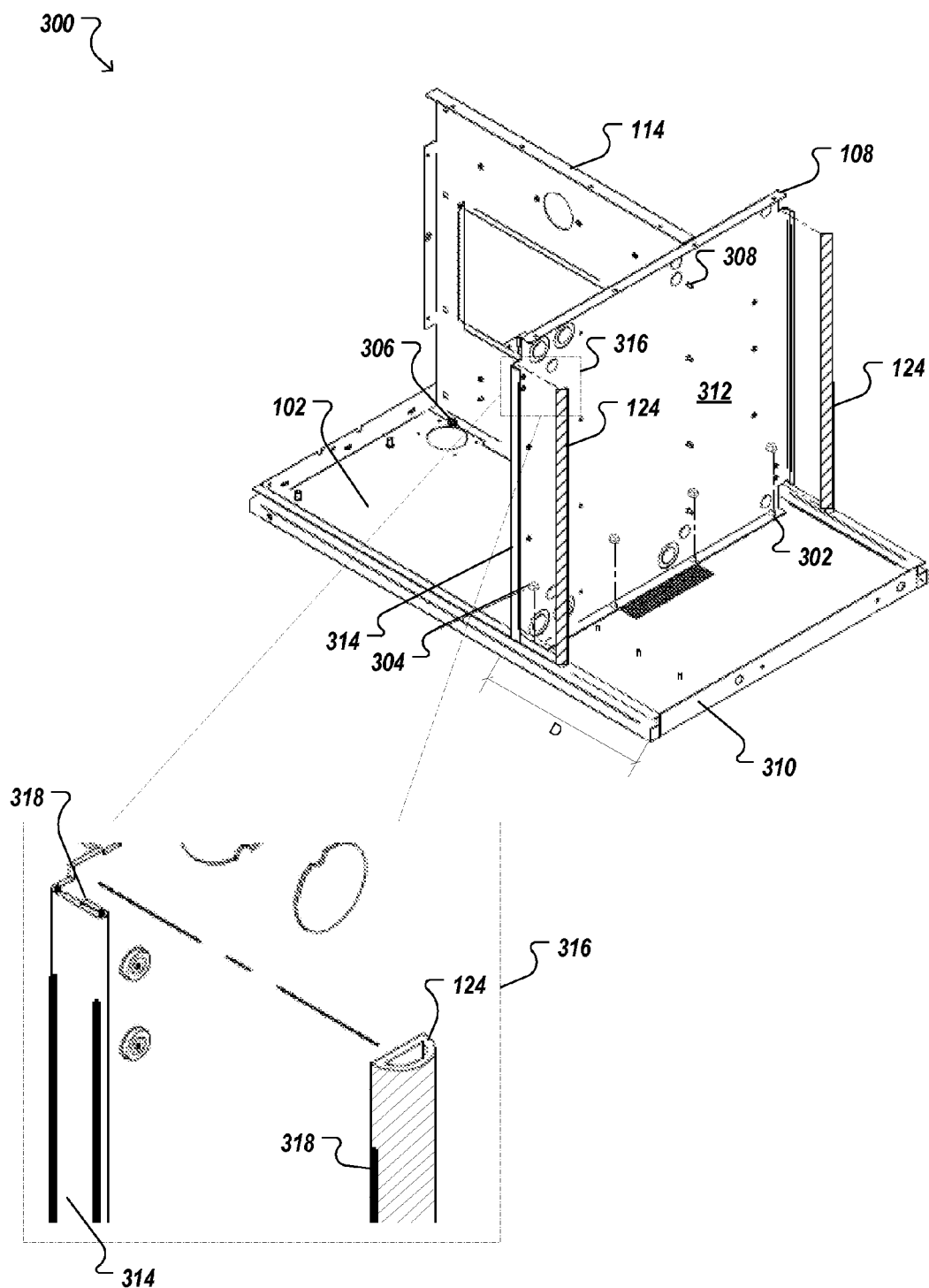
FIG. 3 is another illustration of a partially assembled telecommunications enclosure.

FIG. 3 is another illustration of a partially assembled telecommunications enclosure 300. In FIG. 3, the interior panel 108 and the support panel 114 are each attached to the side panel 102. As mentioned before, the interior panel 108 and the support panel 114 are each directly connected to the side panel 102, independent of a frame, such that the panels themselves provide the support for the enclosure.

As illustrated by FIG. 3, the interior panel 108 is attached to the side panel 102 using threaded components 302 and securing components 304. The threaded components 302 and the securing components 304 can be non-welded fasteners, such as nuts and bolts (or threaded posts that receive the nuts). The support panel 114 is similarly attached to the side panel 102, as illustrated at point 306, and similarly attached to the interior panel, as illustrated at point 308. The interior panel 108 is attached to the side panel 102 at a location that is a distance "D" from a bottom end 310 of the side panel 102.

In some implementations, the sealing material 124 is attached on a bottom side 312 of the interior panel 108 (e.g., a side of the interior panel that is closer to the bottom end 310 than the other side of the interior panel). For example, the interior panel 108 can have a bended portion 314, which extends from the bottom side 312 toward the bottom end 310. In this example, the bended portion can have a mounting edge similar to that discussed above with respect to FIG. 2. The mounting edge of the interior panel 108, however, may simply be a piece of the bended portion that is bended back toward the bottom side 312 of the interior panel 108 (rather than the "U" shape discussed above), so that a mounting portion of the sealing material 124 can slide over the mounting edge to attached to the mounting edge. For example, as shown in more detail in the expanded view of the box 316, the sealing material can include a mounting portion 318 (e.g., a rubber or plastic edge) that can slide over a mounting edge 318 of the bended portion 314.

As illustrated by FIG. 3, the sealing material can be in shapes other than those presented. For example, the sealing material 124 shown in FIG. 3 is a half-circle shape. As discussed in more detail below, placing the sealing material 124 on the bottom side 312 of the interior panel 108 will result in a seal between the equipment chamber and the battery chamber when the removable doors of the enclosure are attached. For example, the removable doors can have a sealing member that engages the sealing material 124 when the door is attached to the enclosure. The force applied to the sealing materials 124 by the sealing member of the door will result in the equipment chamber being sealed (e.g., by causing the sealing material to be expanded in various directions.)

In some implementations, sealing material 124 can be applied to a bottom side of the enclosure top (e.g., 112 of FIG. 1) in a manner similar to that discussed with respect to attaching the sealing material 124 to the bottom side 312 of the interior panel 108. When the sealing material 124 is attached to the bottom side of the enclosure top, a protruding end located at the top of the removable door will engage the sealing material 124 when the removable door is attached to the enclosure.

The sealing material 124 can be attached to both front and back outer ends of the interior panel 108 (e.g., corresponding to sides on which a front and back door are installed on the enclosure). The sealing material 124 can also be attached to both front and back outer ends of the enclosure top (e.g., e.g., corresponding to sides on which a front and back door are installed on the enclosure).

Figure 4:
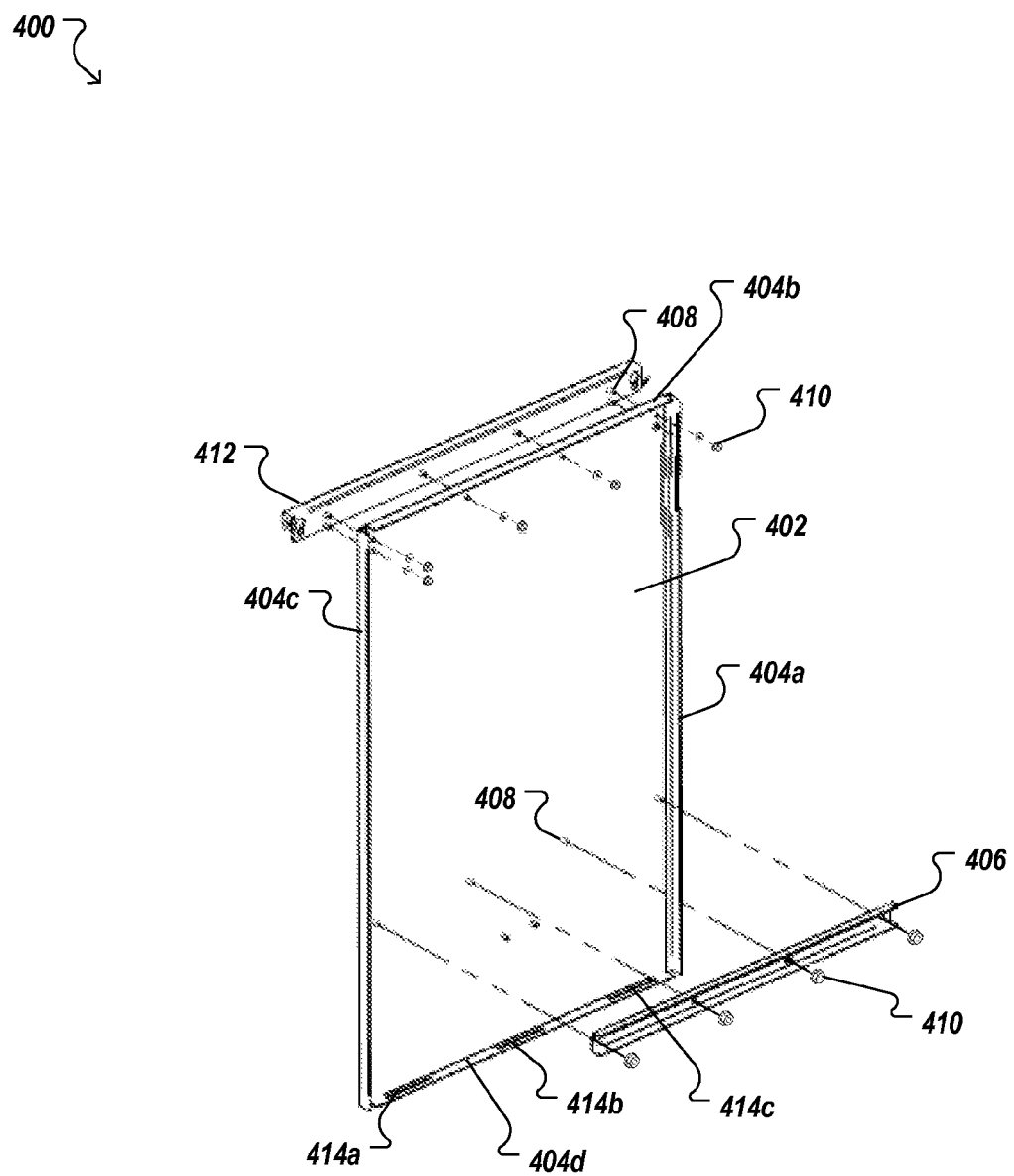
FIG. 4 is an illustration of an example removable door for a telecommunications enclosure.

FIG. 4 is an illustration of an example removable door 400 for a telecommunications enclosure. The removable door 400 has a main door portion 402, and protruding ends 404a, 404b, 404c, and 404d. In some implementations, the main door portion 402 and protruding ends 404a-404d are formed from a continuous piece of metal. For example, protruding ends 404a-404d can be formed by bending portions of the piece of metal so that the protruding ends 404a-404d each extend out from the main door portion 402 in a plane that intersects (or is perpendicular to) a plane defined by the main door portion 402.

Figure 5:
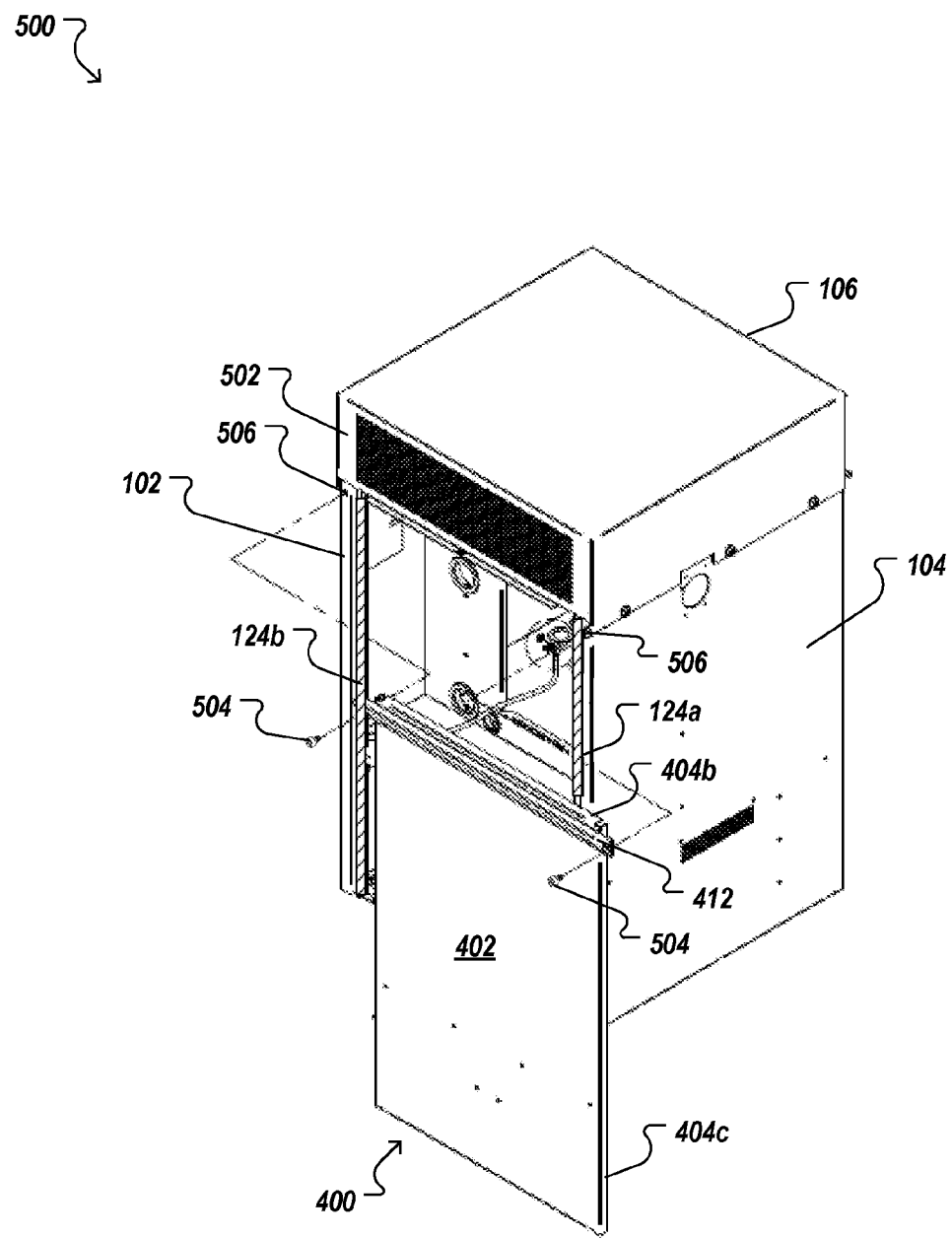
FIG. 5 is another illustration of an example telecommunications enclosure.

In some implementations, the protruding ends 404a-404c are formed to engage the sealing material that is attached to both side panels of the enclosure and the sealing material that is attached to the enclosure top. For example, as illustrated by FIG. 5, which is another illustration of an example telecommunications enclosure 500, the protruding end 404b will engage the sealing material (not shown) that is attached to the bottom side of the enclosure top 106 when the door 400 is attached to the enclosure 500. Similarly, the protruding edge 404c will engage the sealing material 124a that is attached to the side panel 104 when the door 400 is attached to the enclosure 500. The protruding edge 404b (not shown in FIG. 5) will engage the sealing material 124b that is attached to the side panel 102 when the door 400 is attached to the enclosure 500.

With reference again to FIG. 4, the door 400 also includes a sealing member 406 that engages the sealing material that is attached to the interior panel (e.g., 108) of the enclosure. For example, the sealing member 406 can be attached to the main door portion 402 at a location that corresponds to the location of the interior panel in the enclosure, such that when the door 400 is attached to the enclosure, at least a portion of the sealing member will engage the sealing material that is attached to the interior panel (as described above with reference to FIG. 3. The pressure applied to the sealing material by the sealing member 406 will change the shape of the sealing material, thereby creating a seal along the outer end of the interior panel, which extends between the side panels of the enclosure. When the sealing member 406 is engaged with the sealing material of the interior panel, and the protruding ends 404a-c are all engaged with the sealing material (e.g., of the enclosure top and two side panels), a moisture sealed equipment chamber protects the telecommunications equipment that is installed in the equipment chamber.

The sealing member 406 can be attached to the main door portion 402, for example, using non-welded (or welded) fasteners. For example, the sealing member 406 can be attached to the main door portion 402 using a threaded studs 408 (or bolts) and nuts 410 that secure the sealing member 406 to the main door portion 402.

In some implementations, the door 400 can include a rain lip 412 that directs rain away from the enclosure. The rain lip 412 can be, for example, a piece of metal (or another material) having a portion that extends away from the door 400. As installed, the portion of the rain lip 412 that extends away from the door 400 can have a downward slope in the direction away from the door 400. As such, the rain lip 412 will direct water that contacts the rain lip 412 in a direction away from the door 400 (and the enclosure), thereby reducing the likelihood that water will breach the sealing material. The rain lip 412 can be attached to the main door portion 402 in a manner similar to that discussed above with reference to the sealing member 410. For example, the rain lip 412 can be attached to the main door portion 402 using threaded studs 408 (or bolts) and nuts 410 that secure the sealing member 406 to the main door portion 402.

In some implementations, when the door 400 is secured to the enclosure, the rain lip 412 will extend away from the door 400 further than a front edge of the enclosure top 106. For example, with reference to FIG. 5, when the door 400 is attached to the enclosure, the rain lip 412 can extend away from the enclosure (and door) beyond a front panel 502 of the enclosure top 106, while the main door portion 402 can be flush with (or within a specified distance of) the front panel 502.

In some implementations, the rain lip can be formed to create a trough that directs the water to a particular location. For example, the rain lip can be "U" shaped or "V" shaped and angled from one side of the door to the other side of the door so that water can be collected in the "U" or "V" and channeled to one end of the door. Other rain lips can also be used.

In some implementations, the protruding end 404d can have slots 414a, 414b, and 414c defined therein. The slots 414a-414c are formed to receive tabs (e.g., tabs 111a, 111b, and 111c of FIG. 1) protruding from the enclosure bottom (e.g., 110 of FIG. 1). For example, the door 400 can be positioned so that the slots 414a-414c are positioned over the tabs, and the door 400 can be lowered into position so that the tabs slide through the slots 414a-414c. Once the tabs have been inserted into the slots 414a-414c, the protruding ends 404a and 404c can be pressed into the recessed portions 214 described with reference to FIG. 2, and as shown by FIG. 5, non-welded fasteners 504 can be attached to fastener receiving locations 506 (e.g., screw holes or bolt holes) to secure the door 400 to the enclosure 500.

Figure 6:
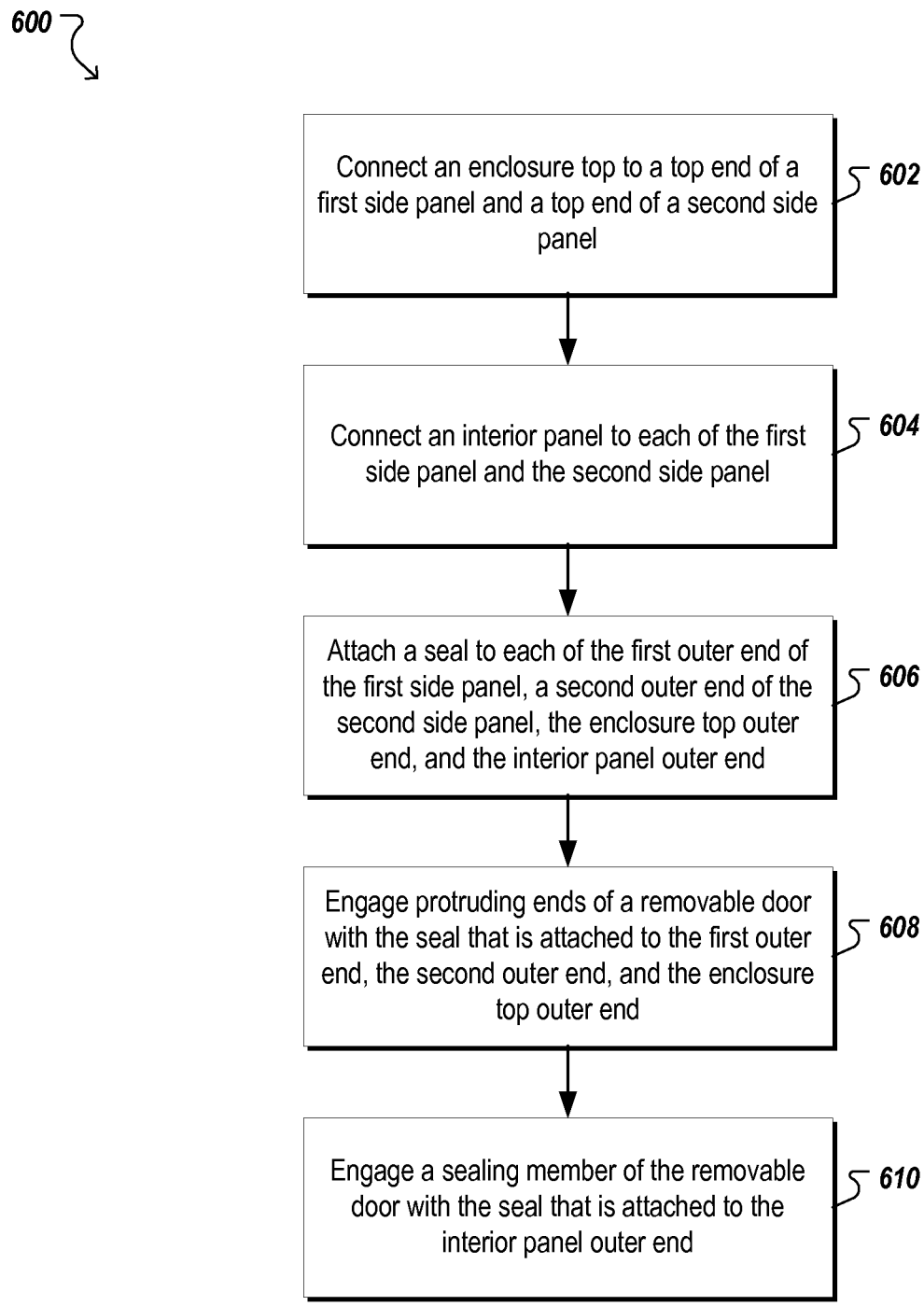
FIG. 6 is a flow chart of an example process for forming a frameless telecommunications enclosure.

FIG. 6 is a flow chart of an example process 600 for forming a frameless telecommunications enclosure. According to the process 600, an enclosure top is connected to a top end of a first side panel and a top end of a second side panel (602). In some implementations, the connection is made independent of an enclosure frame. For example, the enclosure top can be directly connected to each of the first side panel and the second side panel. In some implementations, the enclosure top has an enclosure top outer end that extends between the first side panel and the second side panel.

An interior panel is connected to each of the first side panel and the second side panel (604). In some implementations, the connection is made independent of an enclosure frame. For example, the interior panel can be directly connected to each of the first side panel and the second side panel. In some implementations, the interior panel has an interior panel outer end that extends between the first side panel and the second side panel. The interior panel can be connected, for example, at a location of the first side panel and the second side panel that is a specified distance from a bottom end of each of the first side panel and the second side panel.

A seal is attached to each of a first outer end of the first side panel, a second outer end of the second side panel, the enclosure top outer end, and the interior panel outer end (606). In some implementations, the seals can be attached at locations discussed with reference to FIGS. 1-4.

Protruding ends of a removable door are engaged with the seal that is attached to each of the first outer end, the second outer end, and the enclosure top outer end (608). For example, the removable door can be engaged with the seal in a manner similar to that discussed above with reference to FIGS. 4 and 5.

A sealing member of the removable door is engaged with the seal that is attached to the interior panel outer end (610). For example, the sealing member can be engaged with the seal of the interior panel outer end in a manner similar to that discussed above with respect to FIGS. 4 and 5.

Figure 7:
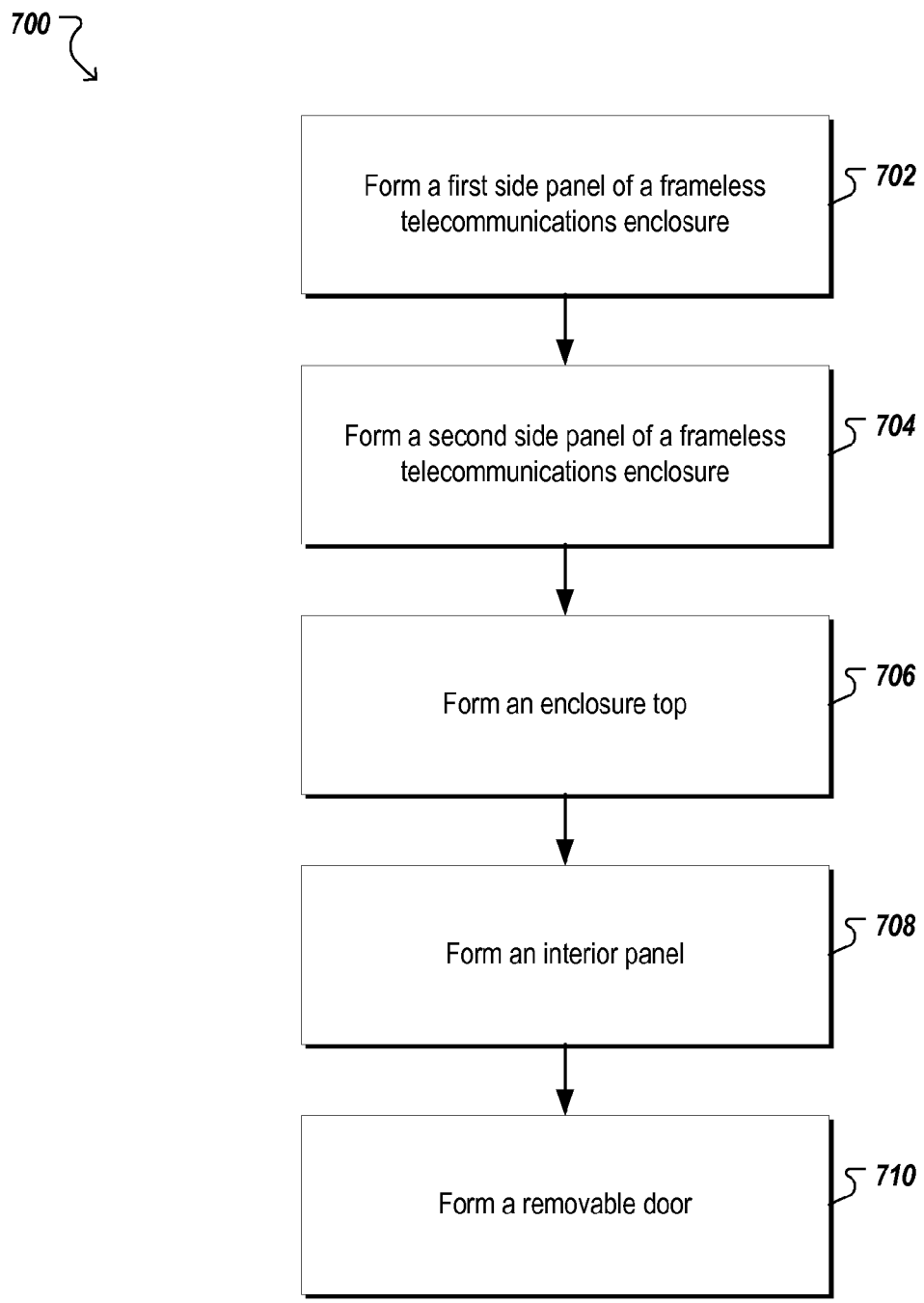
FIG. 7 is a flow chart of another example process for forming a frameless telecommunications enclosure.

FIG. 7 is a flow chart of another example process 700 for forming a frameless telecommunications enclosure. According to the process 700, a first side panel of a frameless telecommunications enclosure is formed (702). In some implementations, the first side panel is formed to have a first outer end that includes a first seal. For example, the first side panel can be a side panel similar to side panel 102 or side panel 104 discussed above with reference to FIGS. 1-5.

A second side panel of a frameless telecommunications enclosure is formed (704). In some implementations, the second side panel is formed to have a second outer end that includes a second seal. For example, the second side panel can be a side panel similar to side panel 102 or side panel 104 discussed above with reference to FIGS. 1-5.

An enclosure top is formed (706). In some implementations, the enclosure top is formed to connect, independent of a frame, to a top end of the first side panel and a top end of the second side panel. The enclosure top can be formed, for example, to have an enclosure top outer end that extends from the first side panel to the second side panel when connected to each of the first side panel and the second side panel. The enclosure top outer end can include a third seal. In some implementations, the enclosure top can be formed to include features similar to those discussed and shown above with reference to FIGS. 1-5.

An interior panel is formed (708). In some implementations, the interior panel is formed to connect, independent of a frame, to each of the first side panel and the second side panel at a specified distance from a bottom end of each of the first side panel and the second side panel. The interior panel can be formed, for example, to have an interior panel outer end that extends from the first side panel to the second side panel when connected to each of the first side panel and the second side panel. The interior panel outer end can be formed to include a fourth seal. In some implementations, the interior panel can be formed to include features similar to those discussed and shown above with reference to FIGS. 1-5.

A removable door is formed (710). In some implementations, the removable door is formed to include protruding ends that engage each of the first seal, the second seal, and the third seal when the removable door is secured to the frameless telecommunications enclosure. The removable door can be formed, for example, to include a sealing member that engages the fourth seal when the removable door is secured to the frameless telecommunications enclosure. The removable door can be formed to include features similar to that discussed and shown above with reference to FIGS. 4 and 5.

While this specification contains many specific implementation details, these should not be construed as limitations on the scope of any inventions or of what may be claimed, but rather as descriptions of features specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results.

Thus, particular embodiments of the subject matter have been described. Other embodiments are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing may be advantageous.

What is claimed is:

1. A frameless telecommunications enclosure comprising:
    a first side panel having a first outer end that includes a first seal;
    a second side panel having a second outer end that includes a second seal;
    an enclosure top connected, independent of a frame, to a top end of the first side panel and a top end of the second side panel, the enclosure top having an enclosure top outer end that extends from the first side panel to the second side panel and includes a third seal;
    an interior panel connected, independent of a frame, to each of the first side panel and the second side panel and having an interior panel outer end that extends from the first side panel to the second side panel and includes a fourth seal, the interior panel being separated from the enclosure top by a first specified distance and being separated by a second specified distance from a bottom end of each of the first side panel and the second side panel; and
    a removable door that is formed to engage each of the first seal, the second seal, the third seal, and the fourth seal when the removable door is secured to the frameless telecommunications enclosure.

2. The frameless telecommunications enclosure of claim 1, wherein the removable door has a main door portion formed in a first plane and protruding ends that extend out from the main door portion in a second plane that intersects the first plane.

3. The frameless telecommunications enclosure of claim 2, wherein the main door portion and the protruding ends are formed from a continuous piece of metal.

4. The frameless telecommunications enclosure of claim 2, wherein at least a portion of the protruding ends engage one of the first seal, the second seal, or the third seal when the removable door is secured to the frameless telecommunications enclosure.

5. The frameless telecommunications enclosure of claim 4, wherein the removable door includes a sealing member that engages the fourth seal when the removable door is secured to the frameless telecommunications enclosure.

6. The frameless telecommunications enclosure of claim 5, wherein a moisture sealed equipment chamber is provided when the sealing member engages the fourth seal and the protruding ends engage each of the first seal, the second seal, and the third seal.

7. The frameless telecommunications enclosure of claim 2, wherein one of the protruding ends has one or more slots defined therein to receive tabs protruding from an enclosure bottom that is connected, independent of a frame, to the bottom end of each of the first side panel and the second side panel.

8. The frameless telecommunications enclosure of claim 2, wherein the removable door includes a rain lip that extends out from the main portion of the removable door.

9. The frameless telecommunications enclosure of claim 1, wherein at least one of the first side panel, the second side panel, or the interior panel comprise aluminum.

10. The frameless telecommunications enclosure of claim 1, wherein:
non-welded fasteners connect the interior panel to each of the first side panel and the second side panel; and
non-welded fasteners connect the enclosure top to the top end of the first side panel and the top end of the second side panel.

11. The frameless telecommunications enclosure of claim 1, wherein the enclosure top comprises a heat exchanger.

12. The frameless telecommunications enclosure of claim 1, wherein a battery chamber is formed in a space between the interior panel and the bottom end of each of the first side panel and the second side panel.

13. A method, comprising:
connecting, independent of a frame, an enclosure top to a top end of a first side panel and a top end of a second side panel, the enclosure top having an enclosure top outer end that extends between the first side panel and the second side panel;
connecting, independent of a frame, an interior panel to each of the first side panel and the second side panel, the interior panel having an interior panel outer end that extends between the first side panel and the second side panel, the interior panel being connected at a specified distance from a bottom end of each of the first side panel and the second side panel;
attaching a seal to each of a first outer end of the first side panel, a second outer end of the second side panel, the enclosure top outer end, and the interior panel outer end;
engaging protruding ends of a removable door with the seal that is attached to each of the first outer end, the second outer end, the enclosure top outer end; and
engaging a sealing member of the removable door with the seal that is attached to the interior panel outer end.

14. The method of claim 13, wherein the removable door has a main door portion formed in a first plane and protruding ends that extend out from the main door portion in a second plane that intersects the first plane.

15. The method of claim 14, wherein the main door portion and the protruding ends are formed from a continuous piece of metal.

16. The method of claim 13, wherein:
non-welded fasteners connect the interior panel to each of the first side panel and the second side panel; and
non-welded fasteners connect the enclosure top to the top end of the first side panel and the top end of the second side panel.

17. The method of claim 13, further comprising forming a battery chamber in a space between the interior panel and the bottom end of each of the first side panel and the second side panel.

18. A method, comprising:
forming a first side panel of a frameless telecommunications enclosure, the first side panel being formed to have a first outer end that includes a first seal;
forming a second side panel of a frameless telecommunications enclosure, the second side panel being formed to have a second outer end that includes a second seal;
forming an enclosure top that connects, independent of a frame, to a top end of the first side panel and a top end of the second side panel, the enclosure top being formed to have an enclosure top outer end that extends from the first side panel to the second side panel and includes a third seal;
forming an interior panel that connects, independent of a frame, to each of the first side panel and the second side panel at a specified distance from a bottom end of each of the first side panel and the second side panel, the interior panel being formed to have an interior panel outer end that extends from the first side panel to the second side panel when connected to each of the first side panel and the second side panel, wherein the interior panel outer end is formed to include a fourth seal; and
forming a removable door that is formed to include protruding ends that engage each of the first seal, the second seal, the third seal when the removable door is secured to the frameless telecommunications enclosure, the removable door further being formed to include a sealing member that engages the fourth seal when the removable door is secured to the frameless telecommunications enclosure.

19. The method of claim 18, wherein the removable door is formed to have a main door portion formed in a first plane and protruding ends that extend out from the main door portion in a second plane that intersects the first plane.

20. The method of claim 19, wherein the main door portion and the protruding ends are formed from a continuous piece of metal.

21. The method of claim 18, wherein:
non-welded fasteners connect the interior panel to each of the first side panel and the second side panel; and
non-welded fasteners connect the enclosure top to the top end of the first side panel and the top end of the second side panel.

* * * * *